(12) United States Patent
Visokay

(10) Patent No.: US 6,809,394 B1
(45) Date of Patent: Oct. 26, 2004

(54) DUAL METAL-ALLOY NITRIDE GATE ELECTRODES

(75) Inventor: Mark R. Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/640,529

(22) Filed: Aug. 13, 2003

(51) Int. Cl.[7] .............................................. H01L 29/00
(52) U.S. Cl. ...................... 257/500; 257/501; 257/369
(58) Field of Search ................................ 257/500, 501, 257/369

(56) References Cited

U.S. PATENT DOCUMENTS

2002/0123189 A1 * 9/2002 Cha et al. .................... 438/228
2004/0080000 A1 * 4/2004 Tsui et al. .................... 257/407

OTHER PUBLICATIONS

Jaehoon Lee et al., "Tunable Work Function Dual Metal Gate Technology for Bulk and Non–Bulk CMOS" International Electronic Device Meeting (IEDM) 2002.

S.B. Samavedam et al., "Dual–Metal Gate CMOS with $HfO_2$ Gate Dielectric" International Electronic Device Meeting (IEDM) 2002.

Huicai Zhong et al., "Properties of Ru–Ta Alloys as Gate Electrodes for NMOS and PMOS Silicon Devices" International Electronic Device Meeting (IEDM) 2001.

Dae–Gyu Park et al., "Robust Ternary Metal Gate Electrodes for Dual Gate CMOS Devices" International Electronic Device Meeting (IEDM) 2001.

* cited by examiner

Primary Examiner—Long Pham
(74) Attorney, Agent, or Firm—Rose Alyssa Keagy; W. James Brady, III; Frederick J. Telecky, Jr.

(57) ABSTRACT

An embodiment of the invention is a gate electrode 70 having a nitrided high work function metal alloy 170 and a low work function nitrided metal alloy 190. Another embodiment of the invention is a method of manufacturing a gate electrode 70 that includes forming and then patterning and etching a layer of high work function nitrided metal alloy 170, forming a layer of low work function nitrided metal alloy 190, and then patterning and etching layers 170 and 190.

20 Claims, 10 Drawing Sheets

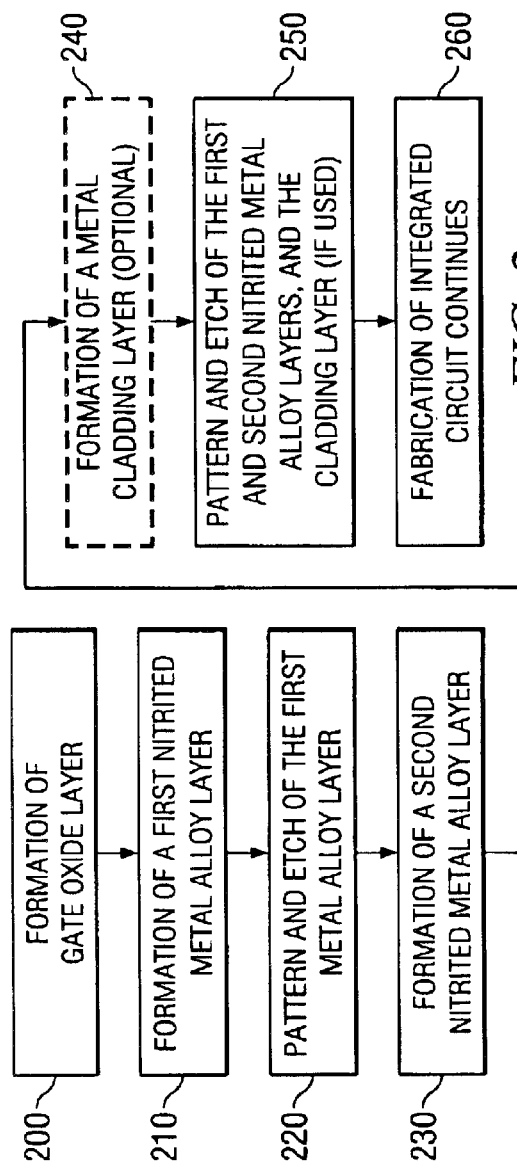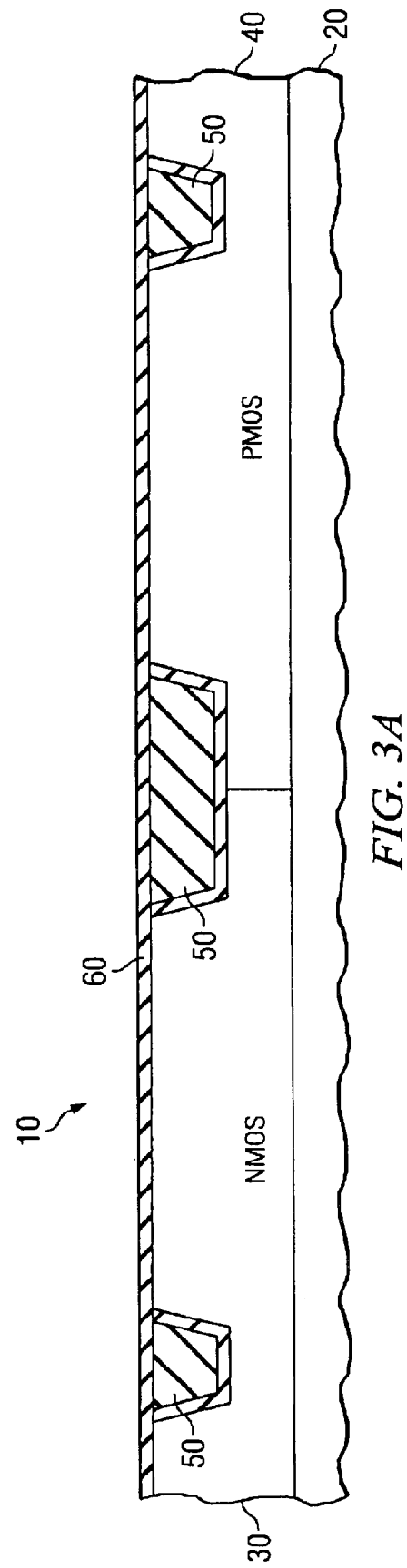
FIG. 2
FIG. 3A

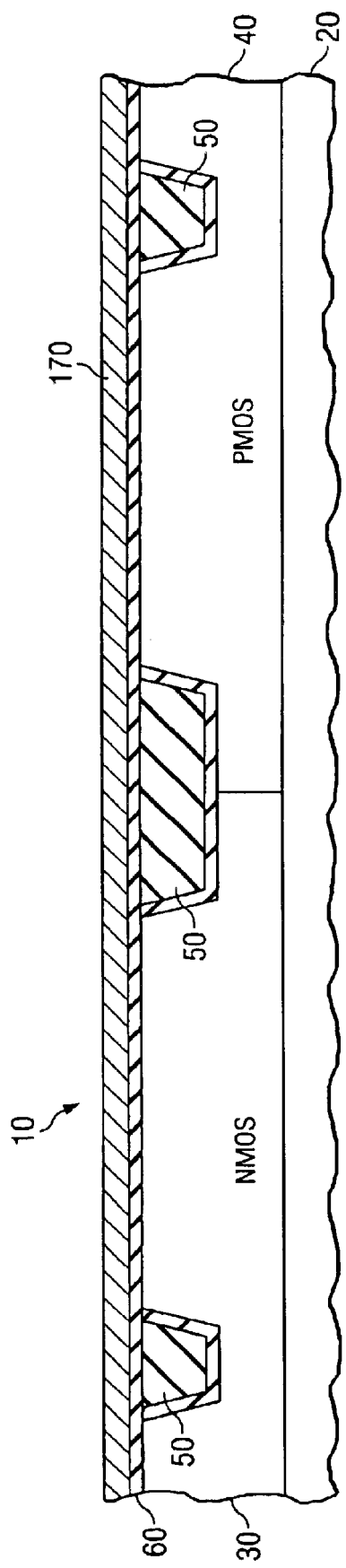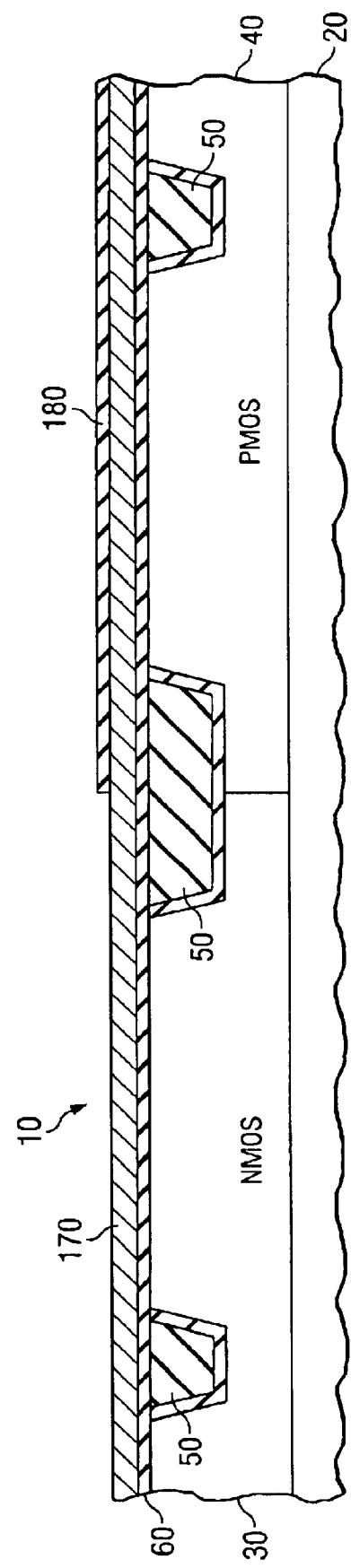

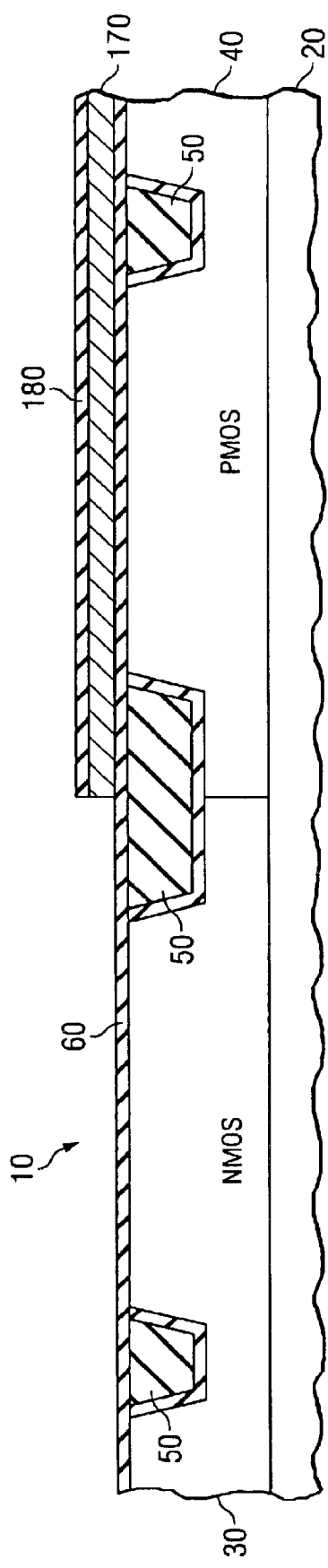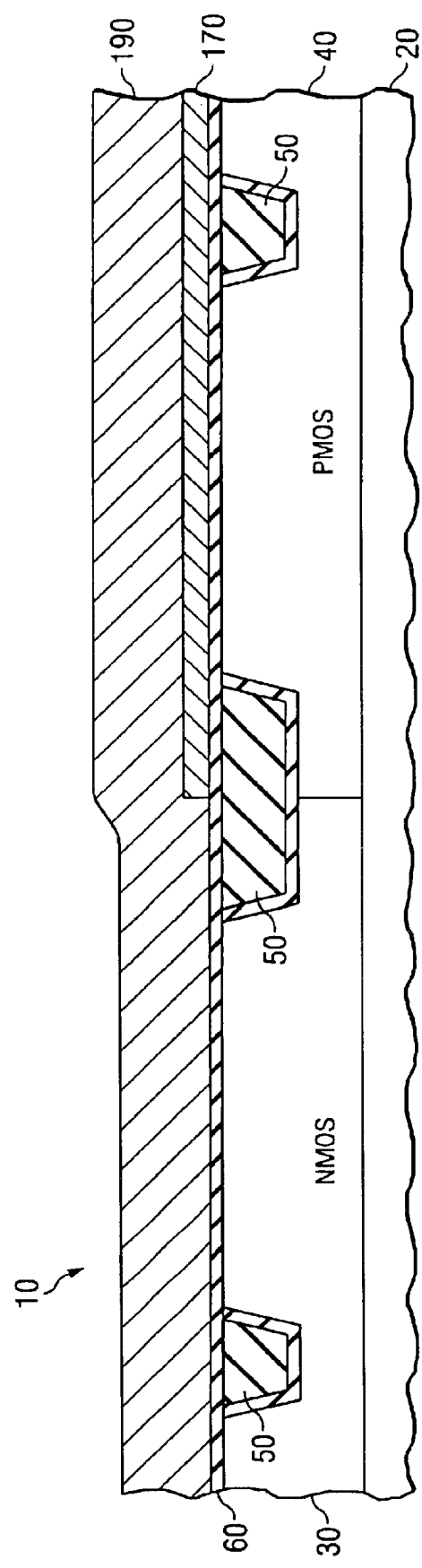

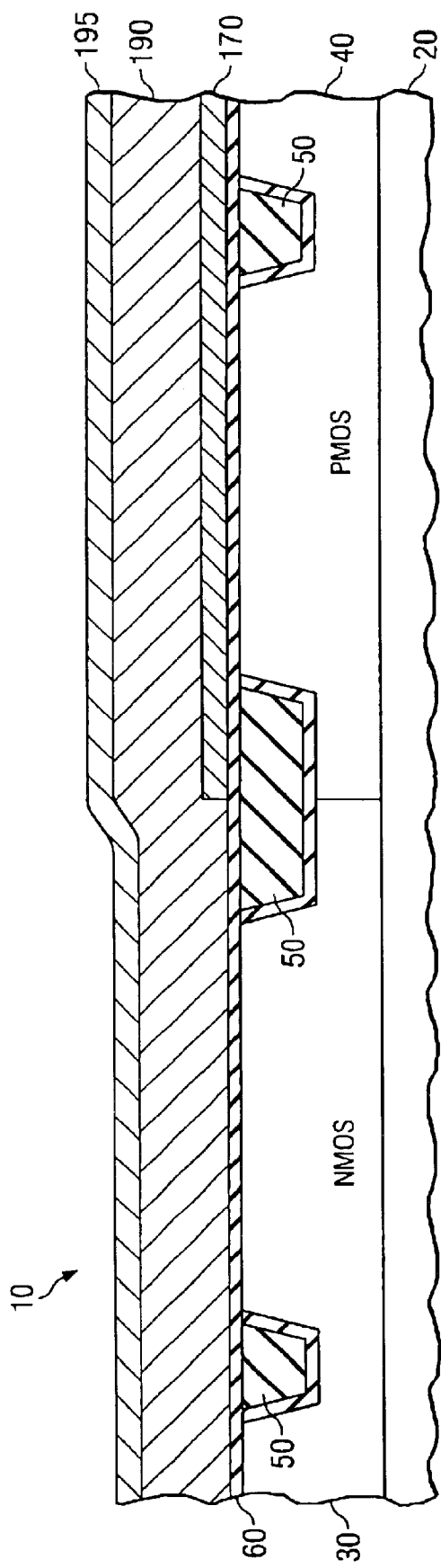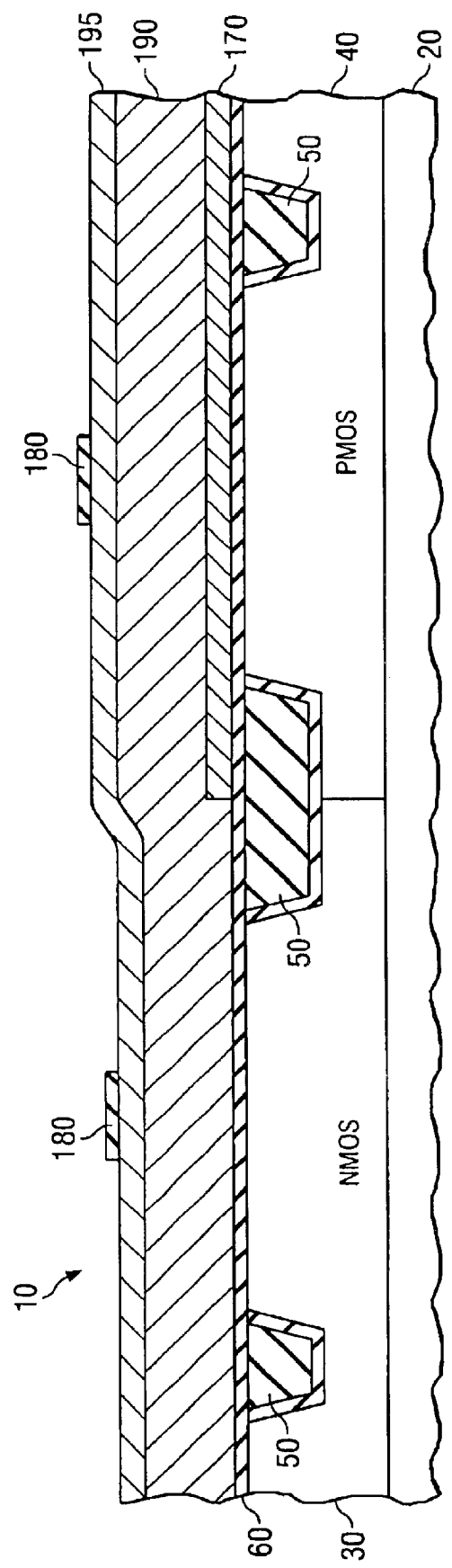

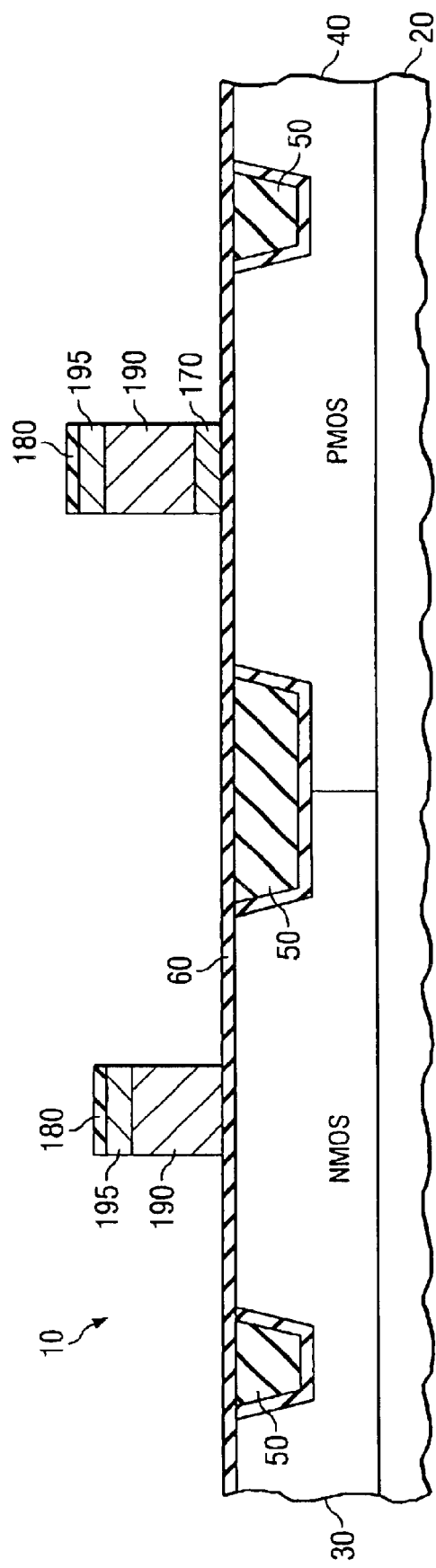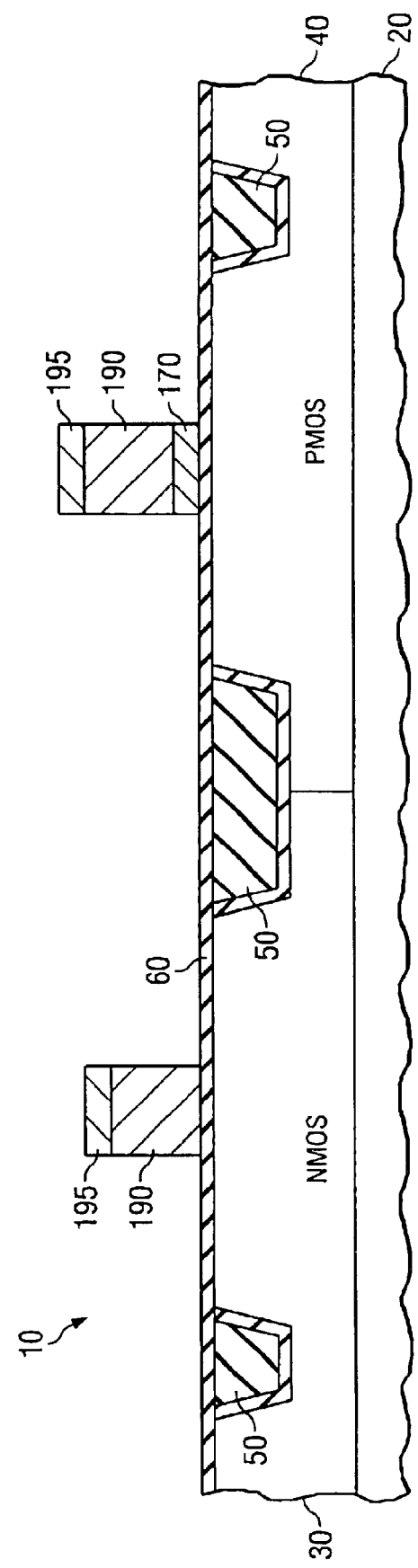

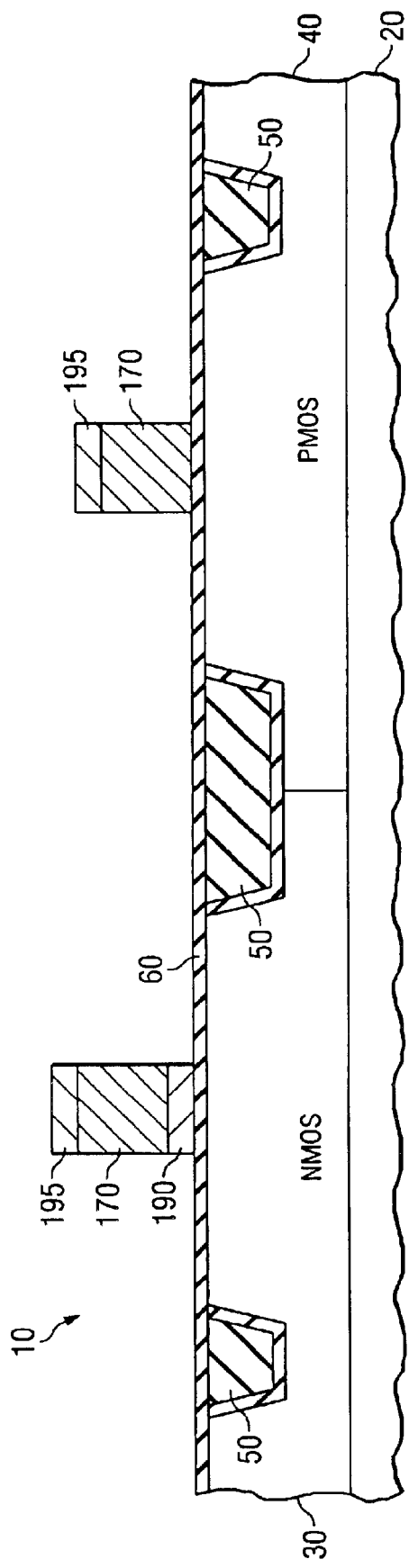
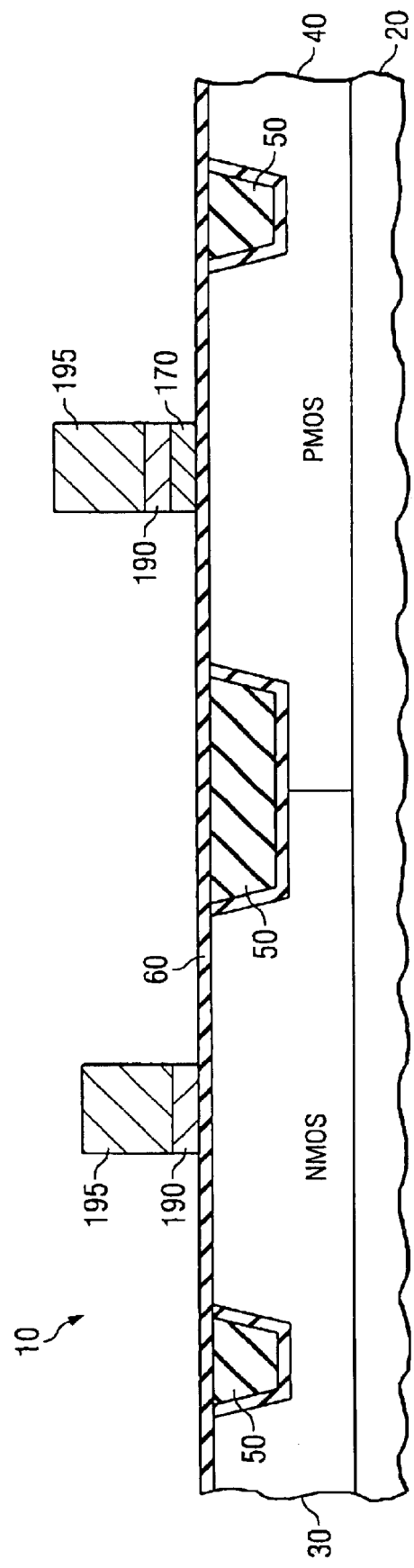

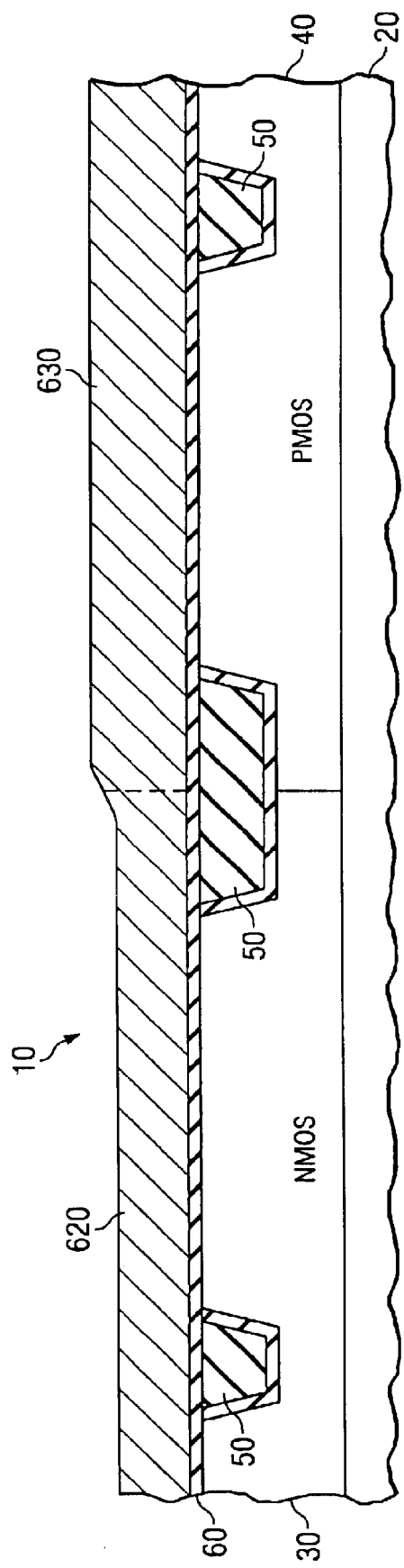
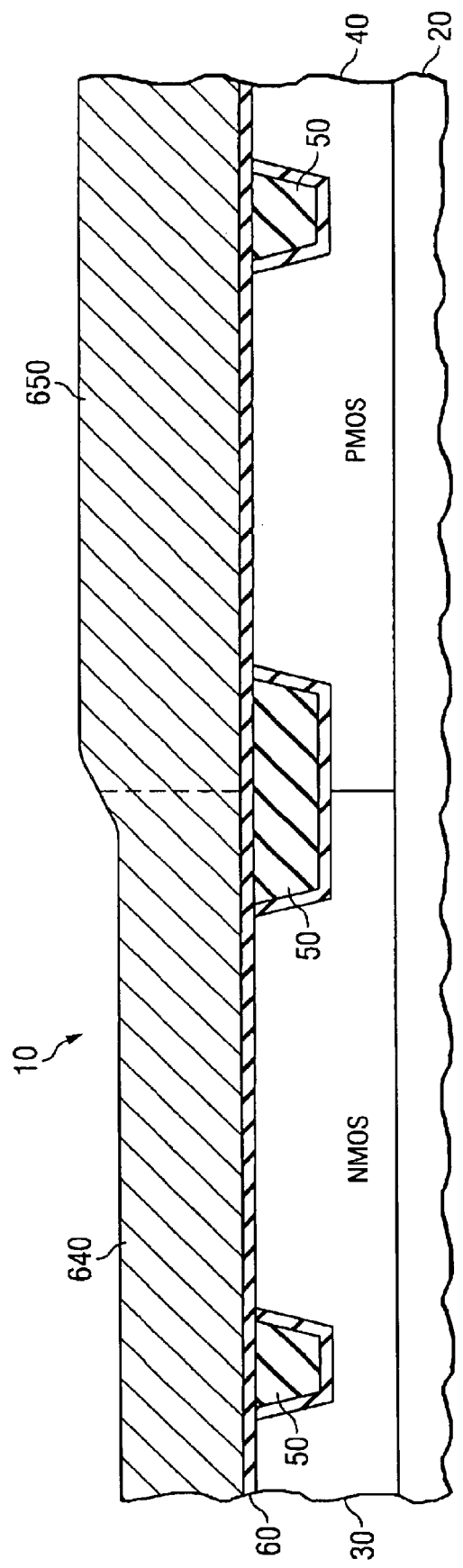

DUAL METAL-ALLOY NITRIDE GATE ELECTRODES

BACKGROUND OF THE INVENTION

This invention relates to a gate electrode having an adjustable work function.

BRIEF DESCRIPTION OF THE DRAWINGS

FIG. 2 is a flow chart illustrating the process flow of one embodiment of the present invention.

FIGS. 3A–3K are cross-sectional views of a partially fabricated semiconductor wafer in accordance with one embodiment of the present invention.

FIGS. 6A–6D are cross-sectional views of a partially fabricated semiconductor wafer in accordance with a fourth embodiment of the present invention.

DETAILED DESCRIPTION OF THE INVENTION

Figure 1:
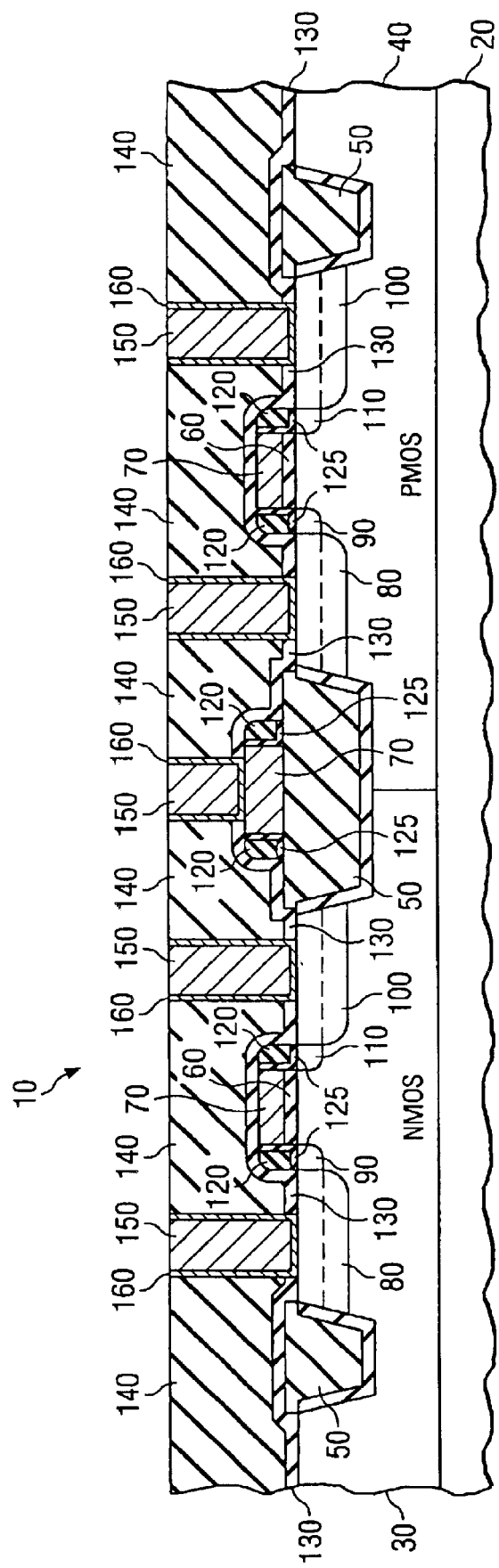
FIG. 1 is a cross-section view of a partial integrated circuit in accordance with the present invention.

The present Invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-section view of a partial integrated circuit 10 in accordance with the present invention. In the example application shown, CMOS transistors are formed within a semiconductor substrate 20 having an NMOS region 30 and a PMOS region 40. The CMOS transistors are electrically insulated from other active devices by shallow trench isolation structures ("STI") 50 formed within the semiconductor substrate; however, any conventional isolation structure may be used such as field oxidation regions (also known as LOCOS regions) or implanted regions. The semiconductor substrate 20 is a single-crystal silicon substrate that is doped to be n-type and p-type; however, it may be formed by fabricating an epitaxial silicon layer on a single-crystal substrate.

The transistors are comprised of a gate, source, and drain. A gate oxide layer 60 and a gate electrode 70 form the gate structure. A source region 80 and a source extension region 90 form the source structure. Similarly, a drain region 100 and a drain extension region 110 form the drain structure. The source region 80 and drain region 100 are formed by implanting a dopant such as As, P, or B into the semiconductor substrate regions 30, 40. The source extension region 90 and the drain extension region 110 are also formed by implanting a dopant such as As, P, or B into the semiconductor substrate regions 30, 40.

The transistors shown in FIG. 1 also have gate sidewalls 120 and "capox" layers 125 that are used during fabrication to create an offset between the source and drain and their respective extension regions. The gate sidewalls 120 are comprised of any suitable material such as an oxide/nitride stack. The capox layers 125 are comprised of any suitable etch stop material such as $SiO_2$.

The transistors have a capping layer 130 that serves as an etch stop layer during the contact etch of the dielectric layer 140. The capping layer 130 is comprised of any suitable material, but is preferably $Si_3N_4$.

Immediately above the transistors is a layer of dielectric insulation 140. Dielectric 140 may be any suitable material such as $SiO_2$. The dielectric material 140 electrically insulates the metal contacts 150 that electrically connect the CMOS transistors shown in FIG. 1 with other active or passive devices (not shown) throughout the integrated circuit. In the example application, the contacts 150 are comprised of W; however, any suitable material (such as Cu, Ti, or Al) may be used. In addition, an optional liner material 160 such as Ti, TiN, or Ta (or any combination or stack thereof) may be used to reduce the resistance at the interface with the Si substrate and to prevent reaction of the contact metal with the Si substrate.

In accordance with the invention, the gate electrode 70 is comprised of a metal alloy or metal alloy stack whose composition can be changed to adjust the work function of the gate electrode. Further in accordance with the present invention, the gate electrode 70 also contains N which provides thermal stability. In the best mode application, the gate electrode metal alloy 70 is Ta—Ru—N. However other alloys are within the scope of the invention. For example, instead of Ru other high work function metals such as Pt, Pd, Ir, or Rh may be used. Instead of Ta, other low work function metals such as Ti, W, Cr, Hf, Zr, or Mo may be used. Gate electrodes 70 containing a high Ru content (and therefore a low Ta content) have high work functions (near 5 eV) and are suitable for PMOS devices. Conversely, gate electrodes 70 containing a low Ru content (and therefore a high Ta content) have low work functions (near 4 eV) and are suitable for NMOS devices. Consequently, the composition of gate electrodes 70 is adjusted throughout the integrated circuit 10 to adjust—and thereby optimize—the work function of the transistors located in the NMOS regions 30 and PMOS regions 40 of an integrated circuit 10.

FIG. 2 is a flow chart illustrating the process flow of one embodiment of the present invention. In addition, FIGS. 3A–3K are cross-sectional views of a partially fabricated semiconductor wafer in accordance with one embodiment of the present invention. Other than process steps 210 and 230, the manufacturing process steps should be that standard in the industry.

The first step in the formation of the gate is the formation of the gate oxide 60. In step 200, as shown in FIG. 3A, a gate oxide layer 60 (preferably comprised of silicon dioxide, silicon oxynitride, silicon nitride, metals oxides such as $HfO_2$, silicate materials such as HfSiO, nitrided silicate materials such as HfSiON, any other high-k material, or any combination or stack thereof) is formed on the semiconductor substrate 10. In accordance with the invention, the gate electrode is now formed using any one of a variety of processes and steps, as described below.

In the best mode application, a reactive sputtering process is used to form the layers of nitrided high work function and low work function metal alloys of the gate electrode 70 shown in FIG. 1. In a first example, shown in FIG. 3B, a layer 170 of high work function nitrided metal alloy is formed (step 210) over the semiconductor substrate (i.e. over the gate oxide layer 60). The reactive sputtering process may be performed using any suitable machine such as the Endura 5500 by AMT. In the best mode application the high work function nitrided metal layer is formed by using a target metal that is a Ru—Ta metal alloy having a majority atomic concentration of Ru (i.e the alloy has a Ru content of at least 50%). In the reactive sputtering process Ar and N gasses bombard the target metal, thereby creating a nitrided Ru—Ta metal alloy layer 170 on the surface of the semiconductor substrate 10. However it is within the scope of the invention to use other machines, other Physical Vapor Deposition ("PVD") processes, or other deposition processes such as chemical vapor deposition (CVD) to form the nitrided high work function metal alloy layer 170 on the surface of the semiconductor substrate 10.

In step 220, shown in FIG. 3C, the high work function layer 170 is patterned in order to remove the material from the NMOS regions 30 of the semiconductor substrate 10. Any suitable patterning process may be used to pattern layer 170. For example, a film of inorganic anti-reflective coating 180 (such as SiON) is applied over the semiconductor substrate and then a reticle is used to expose and thereafter etch the desired pattern onto the coating 180. Next, the unwanted nitrided metal alloy layer 170 is removed from the NMOS regions 30, as shown in FIG. 3D, using an etching process such as a dry etch containing F and O. Thereafter the inorganic anti-reflective coating ("ARC") is cleaned off the semiconductor wafer 10 using any suitable process such as hot phosphoric wet strip.

In this example application, a layer of low work function nitrided metal alloy 190 is now formed (step 230) over the semiconductor substrate 10. In the best mode application, a reactive sputtering process is used to form a layer 190 of low work function nitrided metal alloy, as shown in FIG. 3E. In the best mode application the low work function nitrided metal layer is formed by using a target metal that is a Ta—Ru metal alloy having a majority atomic concentration of Ta (i.e. the alloy has a Ta content of at least 50%). In the reactive sputtering process Ar and N gasses bombard the target metal, thereby creating a nitrided Ta—Ru metal alloy layer 190 on the surface of the semiconductor substrate 10. Again, it is within the scope of the invention to use other machines, other Physical Vapor Deposition ("PVD") processes, or other deposition processes such as CVD to form the low work function nitrided metal alloy layer 190 on the surface of the semiconductor substrate 10.

A metal cladding layer 195 is now formed (step 240) over the low work function metal alloy layer 190 in the best mode application. However the addition of this layer, shown in FIG. 3F, is optional. If present, the cladding layer 195 reduces the sheet resistance where high resistivity metal alloy nitrides are used. In the best mode application the cladding layer 195 is W and it is formed using a CVD process. Additionally, a semiconductor layer such as polycrystalline Si could also be used. In this case the polycrystalline silicon could be doped at the same time as the source 80, drain 100, source extension 90 and drain extension 110 regions are doped in order to yield sufficient conductivity.

In step 250 the metal cladding layer 195, the low work function layer 190, and the high work function layer 170 are etched to form the gate electrodes 70 shown in FIG. 1. As shown in FIG. 3G, the inorganic ARC 180 is applied, patterned, and etched in the same manner described above. The inorganic ARC 180 facilitates the proper etching of the semiconductor wafer 10 to form the gate electrodes 70.

As shown in FIG. 3H a dry etch process is used to etch the metal cladding layer 195, the low work function layer 190, and the high work function layer 170. Thereafter the inorganic anti-reflective coating ("ARC") is cleaned off the semiconductor wafer 10, as shown in FIG. 3I, using any suitable process such as hot phosphoric wet strip.

The manufacturing processes described above will create a CMOS transistor structure with metallic gate electrodes having work functions adjusted independently for NMOS and PMOS devices. For example, in the application described above a high work function gate (170, 190) is created for devices located in PMOS regions 40 and a low work function gate (190) is created for devices located in NMOS regions 30.

It is to be noted that anneal processes may be used after any step in the above-described process. When used, the anneal process can improve the microstructure of materials and improve the quality of the semiconductor structure.

Referring again to FIG. 2, the manufacturing process continues until the final integrated circuit structure is complete (step 260). Referring to FIG. 1, these next steps may be the implantation of the source and drain extension regions (90, 110), the formation of the gate sidewalls (120), the implantation of the source and drain regions (80, 100), and then the formation of a polysilicon capping layer (130).

As shown in FIG. 3I the height of the high work function nitrided metal alloy layer 170 is much less than the height of the low work function nitrided metal alloy layer 190. This height ratio is used to ease the subsequent fabrication of the semiconductor wafer. In the best mode application the height of the thinner layer (i.e. the high work function nitrided metal alloy layer 170 shown in FIG. 3I) is in the range of 5 Å to 100 Å, and the height of the thicker layer (i.e. the low work function nitrided metal alloy layer 190 shown in FIG. 3I) is in the range of 5 Å to 100 Å. However, the heights of layers 170 and 190 may range from 5 Å to 2500 Å. Furthermore, as long as the desired gate work function is obtained, the heights of layers 170 and 190 may be equal or different from each other. Together, the high work function nitrided metal alloy layer 170 andlor the low work function nitrided metal alloy layer 190, with or without the cladding layer 195, comprise the gate electrode 70, shown in FIG. 1.

It is within the scope of the invention to design a gate electrode having any one of numerous alternative structures. For example, as shown in FIG. 3J, the low work function nitrided metal alloy 190 may be formed first and then removed from the PMOS region 40. Then the layer of high work function nitrided metal alloy 170 and the optional cladding layer 195 are formed and then the gate electrode etched. In yet another alternative gate electrode structure, shown in FIG. 3K, the height of the metal cladding layer 195 may far exceed the height of both nitrided metal alloy layers 170 and 190.

Figure 4:
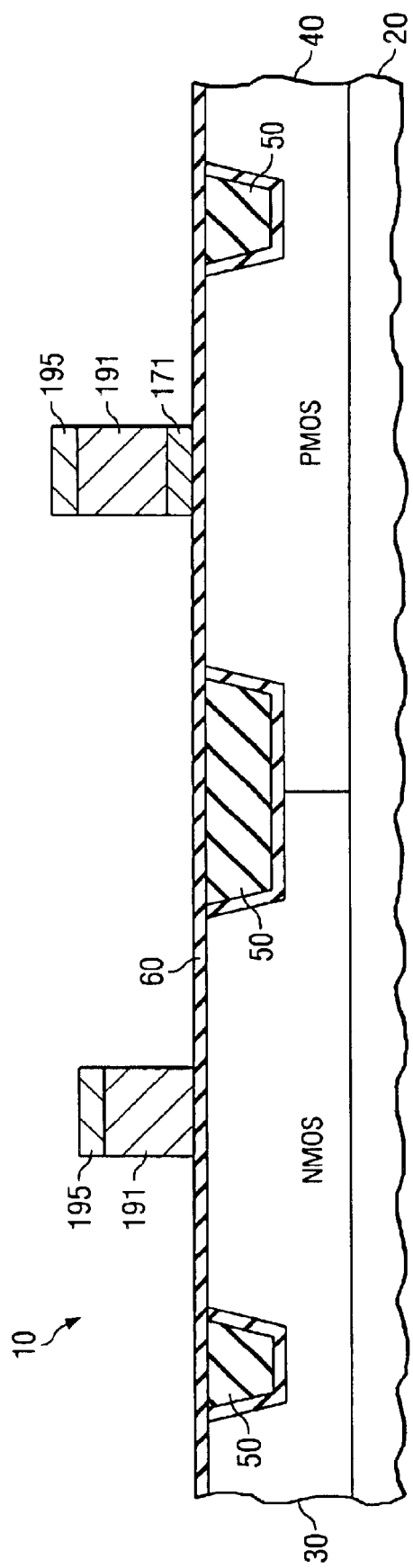
FIG. 4 is a cross-sectional view of a partially fabricated semiconductor wafer in accordance with a second embodiment of the present invention.

Furthermore, it is within the scope of the invention to fabricate the gate electrodes using any one of many alternative fabrication processes. For example, as shown in FIG. 4, the gate electrode stacks containing a high work function metal alloy 171 and a low work function metal alloy 191 are initially formed using a PVD process (e.g. sputtering). Then, a nitrogen plasma nitridation process, ammonia anneal, or a nitrogen ion implantation process is used to create the high work function nitrided metal alloy 170 and the low work function nitrided metal alloy 190. Subsequently, a metal cladding layer 195 is deposited on top of the nitrided stack 170, 190.

Figure 5:
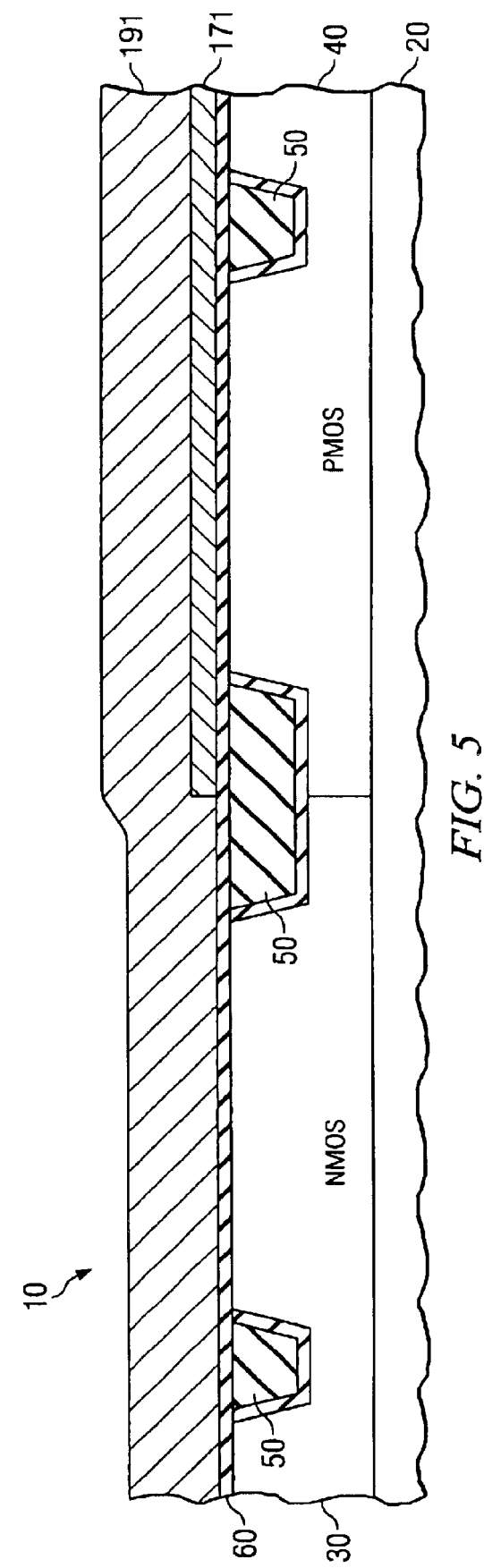
FIG. 5 is a cross-sectional view of a partially fabricated semiconductor wafer in accordance with a third embodiment of the present invention.

In another variation, shown in FIG. 5, a nitridation process is used to interdiffuse nitrogen into the high work function metal layer 171 and the low work function metal layer 191 after the layers 171 and 191 are formed but before the gate electrode stack is etched. Alternatively, the nitridation process could occur once after the metal alloy 171 is formed, and a final time after the metal alloy 191 is formed in order to create the nitrided metal alloys 170 and 190 before the gate electrode stack is etched.

Figure 6A:
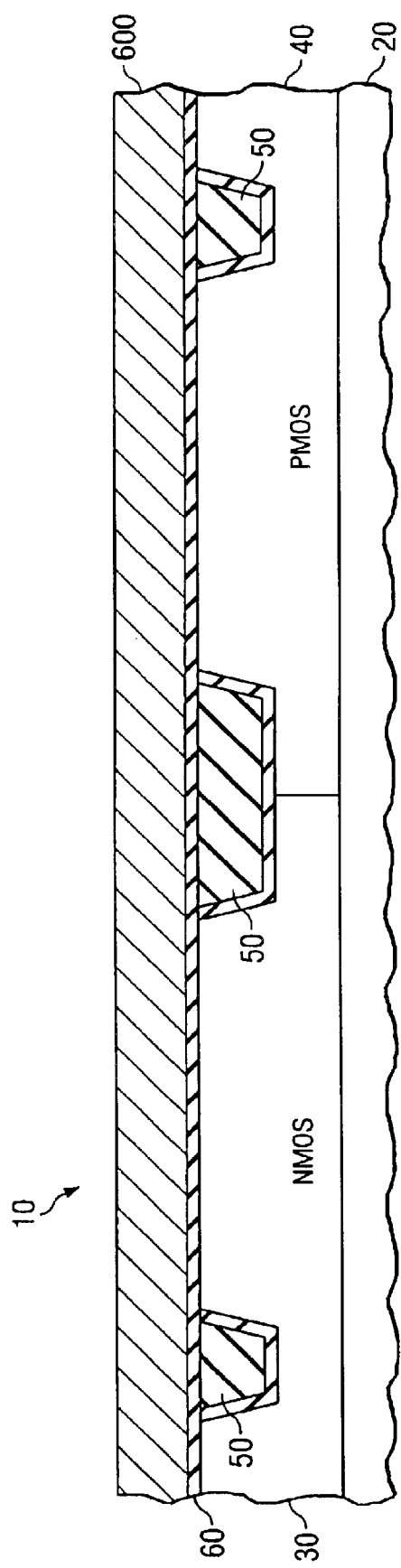
Figure 6B:
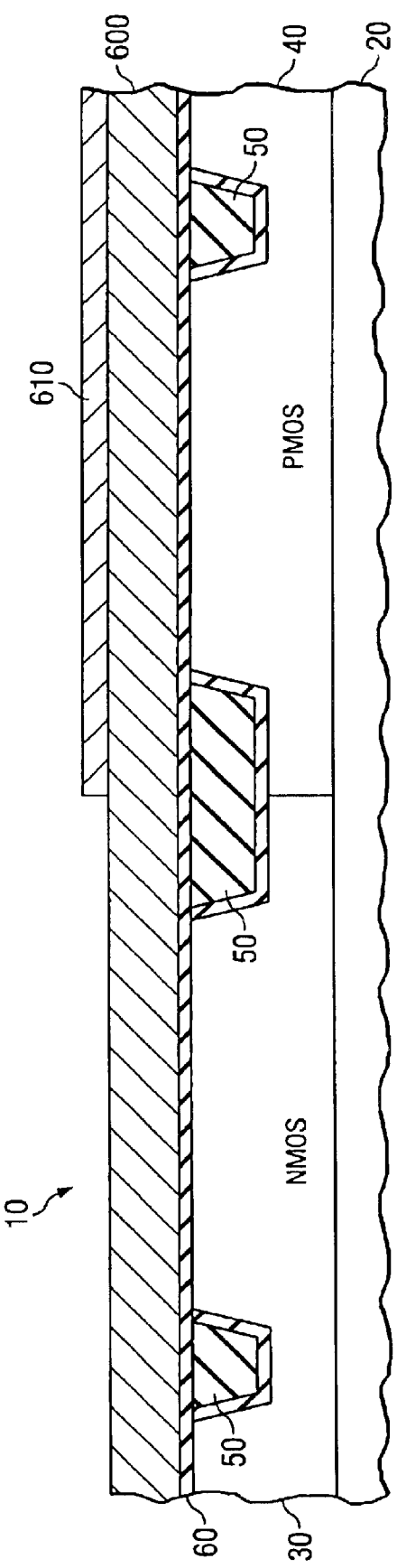

In yet another manufacturing process, shown in FIGS. 6A–6D, the high work function metal and the low work function metal are formed by a different manufacturing process. As shown in FIG. 6A a layer of low work function metal alloy 600, such as Ru—Ta (with a high Ta content), is formed over the semiconductor substrate 10. Then a layer of high work function metal 610, such as Ru or a metal alloy such as Ru—Ta (with a high Ru content), is formed over the metal alloy 600. The layer of high work function metal or metal alloy 610 is patterned and etched in order to remove the unwanted high work function metal layer 610 from the NMOS region 30, as shown in FIG. 6B. The semiconductor wafer 10 is then annealed to interdiffuse the high work function metal or metal alloy 610 into the metal alloy 600. After the anneal, the layer 630 (which is formed from the interdiffusion of layers 600 and 610) has a higher work function than that of the low work function layer 600. The final result, as shown in FIG. 6C, is a low work function metal region 620 located over the NMOS portions 30 of the semiconductor wafer 10 and a high work function metal region 630 located over the PMOS portions 40 of the semiconductor wafer 10. A nitridation process (e.g. nitrogen ion implantation, plasma nitridation, or ammonia anneal) is then used to create a low work function nitrided metal alloy 640 located over the NMOS regions 30 and a high work function nitrided metal alloy 650 located over the PMOS regions 40. Once the nitrided metal alloys 640 and 650 are formed, the gate electrodes are etched and the normal wafer fabrication process continues. It is to be noted that a cladding layer 195 can be optionally added before the gate electrode etching.

Various modifications to the invention as described above are within the scope of the claimed invention. For example, the nitrided metal alloy layers 170, 190 or metal alloy layers 171, 191 may be formed using the techniques described above or using other well known manufacturing techniques such as Chemical Vapor Deposition ("CVD"). Instead of implementing the invention in CMOS structures, the invention may be used in NMOS only or PMOS only structures. The invention is applicable in semiconductor wafers having different well and substrate technologies, dopant types, dopant strengths, or transistor configurations. Furthermore, the integrated circuit may use any number of various metal layers, barrier layers, device structures, active elements and passive elements. Moreover, instead of using the silicon crystal semiconductor substrate described above, the invention is applicable to other semiconductor technologies such as BiCMOS, bipolar, SOI, strained silicon, microelectrical mechanical system ("MEMS"), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A CMOS circuit comprising:
   a first gate electrode having a low work function nitrided metal alloy and a high work function nitrided metal alloy; and
   a second gate electrode having a high work function nitrided metal alloy.

2. The CMOS circuit of claim 1 wherein said high work function nitrided metal alloy has a majority atomic concentration of Ru.

3. The CMOS circuit of claim 1 wherein said low work function nitrided metal alloy has a majority atomic concentration of Ta.

4. The CMOS circuit of claim 1 wherein said high work function nitdded metal alloy has a majority atomic concentration of Ru, Pt, Pd, Ir, or Rh.

5. The CMOS circuit of claim 1 wherein said low work function nitrided metal alloy has a majority atomic concentration of Ta, Ti, Hf, Mo, W, Cr, or Zr.

6. The CMOS circuit of claim 1 wherein a work function of said first gate electrode is controlled by the amount of said high work function nitrided metal alloy and said low work function nitrided metal alloy.

7. The CMOS circuit of claim 1 wherein a work function of said second gate electrode is controlled by the amount of said high work function nitrided metal alloy.

8. The CMOS circuit of claim 1 wherein said first gate electrode and said second gate electrode have a thickness between 5 Å and 2500 Å.

9. The CMOS circuit of dalm 1 wherein a thickness of said high work function nitrided metal alloy is different from a thickness of said low work function nirided metal alloy.

10. The CMOS circuit of claim 1 wherein said first gate electrode is located in a NMOS region, and said low work function nitrided metal alloy of said first gate electrode is coupled to a gate dielectric.

11. A CMOS circuit comprising:
    a first gate electrode having a high work function nitrided metal alloy and a low work function nitrided metal alloy; and
    a second gate electrode having a low work function nitrided metal alloy.

12. The CMOS circuit of claim 11 wherein said high work function nitrided metal alloy has a majority atomic concentration of Ru.

13. The CMOS circuit of claim 11 wherein said low work function nitrided metal alloy has a majority atomic concentration of Ta.

14. The CMOS circuit of claim 11 wherein said high work function nitrided metal alloy has a majority atomic concentration of Ru, Pt, Pd, Ir, or Rh.

15. The CMOS circuit of claim 11 wherein said low work function nitrided metal alloy has a majority atomic concentration of Ta, Ti, Hf, Mo, W, Cr, or Zr.

16. The CMOS circuit of claim 11 wherein a work function of said first gate electrode is controlled bylhe amount of said high work function nitrided metal alloy and said low work function nitrided metal alloy.

17. The CMOS circuit of claim 11 wherein a work function of said second gate electrode is controlled by the amount of said low work function nitrided metal alloy.

18. The CMOS circuit of claim 11 wherein said first gate electrode and said second gate electrode have a thickness between 5 Å and 2500 Å.

19. The CMOS circuit of claim 11 wherein a thickness of said high work function nitrided metal alloy is different from a thickness of said low work function nitrided metal alloy.

20. The CMOS circuit of claim 11 wherein said first gate electrode is located in a PMOS region, and said high work function nitrided metal alloy of said first gate electrode is coupled to a gate dielectric.

* * * * *